United States Patent [19]

Pauly

[11] Patent Number: 4,985,677

[45] Date of Patent: Jan. 15, 1991

[54] MAGNETIC RESONANCE IMAGING AND SPECTROSCOPY USING AN EXCITATION PULSE FOR MULTIPLE-DIMENSIONAL SELECTIVITY

[75] Inventor: John M. Pauly, Menlo Park, Calif.

[73] Assignee: The Board of Trustees of the Leland Stanford Junior University, Stanford, Calif.

[21] Appl. No.: 370,403

[22] Filed: Jun. 22, 1989

[51] Int. Cl.$^5$ ............................................. G01R 33/20
[52] U.S. Cl. ..................................................... 324/309
[58] Field of Search ........ 324/300, 307, 309, 311–314, 324/318, 322

[56] References Cited

U.S. PATENT DOCUMENTS 4,307,343 12/1981 Likes .................................... 324/309
4,642,567 2/1987 Kaplan .................................. 324/309

OTHER PUBLICATIONS

J. Pauly, D. Nishimura, and A. Macovski "A k-Space Analysis of Small-Tip-Angle Excitation", Journal of Magnetic Resonance 81, 43–56, 1989.
C. H. Meyer, J. Pauly, A. Macovski, and D. Nishimura, abstract of "Selective Excitation for Fast Imaging", Second European Congress of NMR in Medicine and Biology, Berlin, Jun. 23–26, 1988.

*Primary Examiner*—Michael J. Tokar
*Attorney, Agent, or Firm*—Henry K. Woodward

[57] ABSTRACT

A method of obtaining multi-dimensional spatially-selective magnetic resonance signals from a body includes applying a static magnetic field (Bo) to said body thereby aligning nuclear spins along an axis (z), and applying one or more time-varying magnetic gradients (Gx(t), Gy(t), Gz(t)) during a time period, T. During the time period, T, an RF excitation pulse ($B_1$) is applied to said body to tip said nuclear spins, said RF excitation pulse being related to said modulated magnetic gradients by a first spatial frequency weighting function (W(k)(t)) whereby magnetic resonance signals transmitted by said tipped nuclear spins are spatially selective in multi dimensions. The resulting magnetic resonance signals are then detected to provide the multi-dimensional spatially-selective signals.

12 Claims, 13 Drawing Sheets

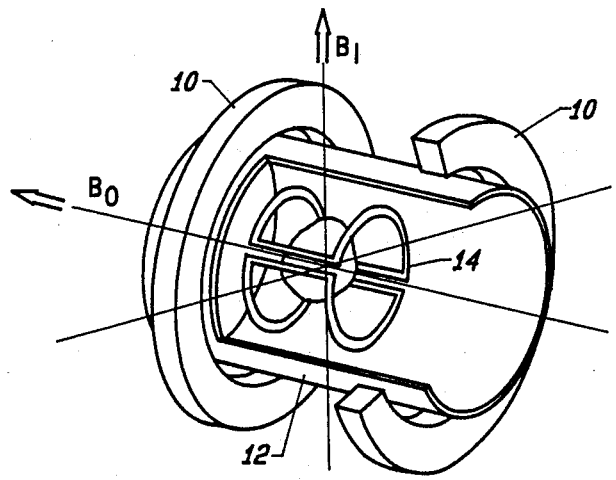
FIG. 1A
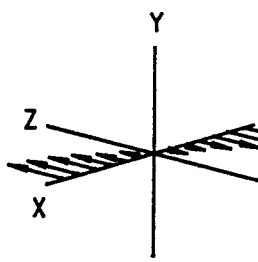   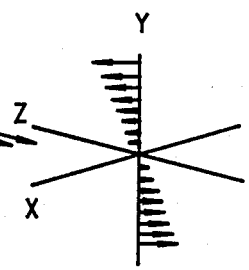   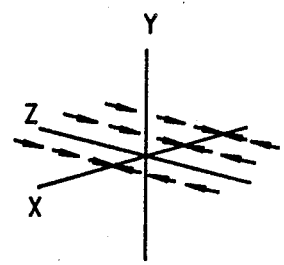
FIG. 1B     FIG. 1C     FIG. 1D
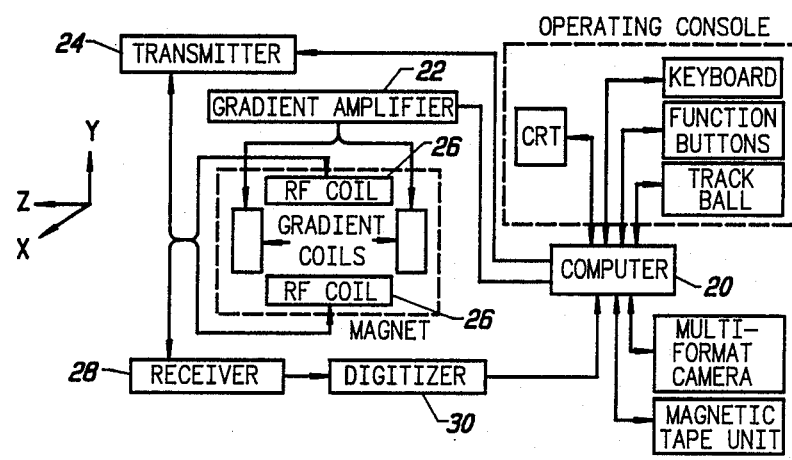
FIG. 2

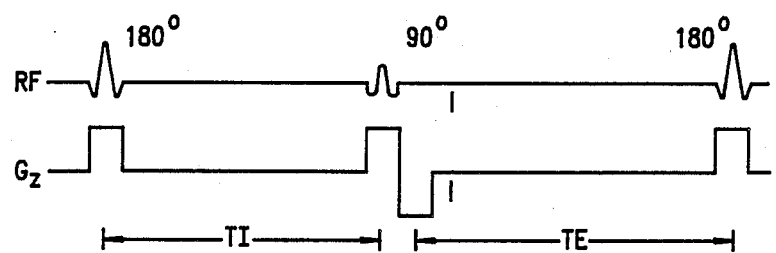
FIG. 3
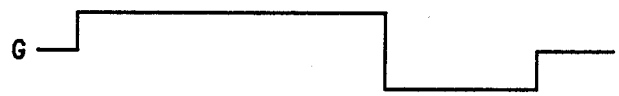
FIG. 4
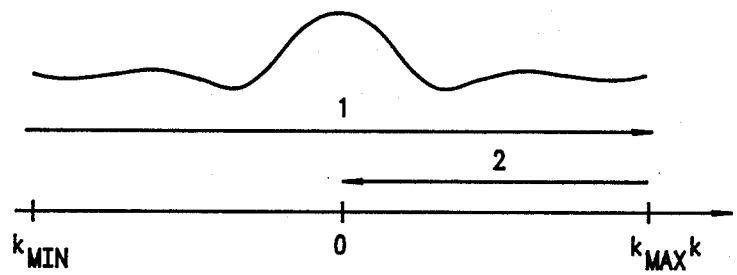
FIG. 5

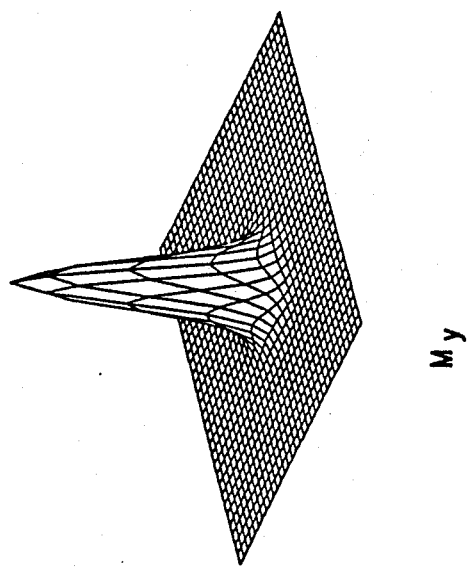
FIG. 13B  $M_y$
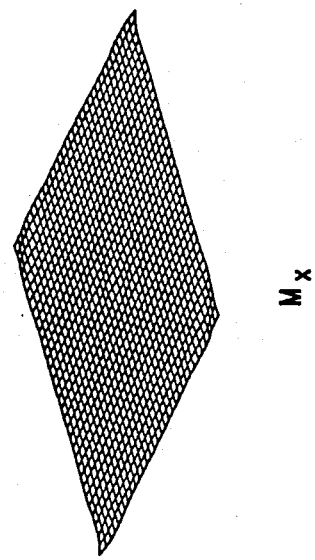
FIG. 13A  $M_x$

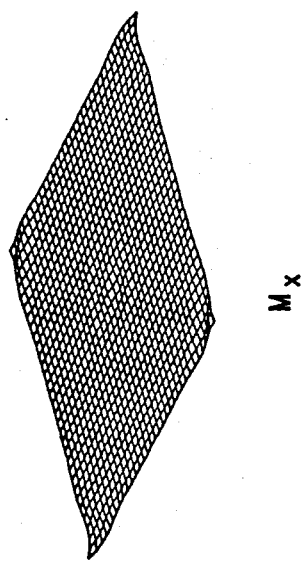
FIG. 14A $M_x$
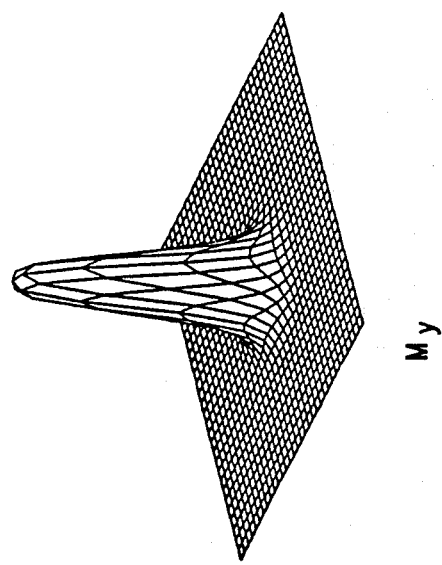
FIG. 14B $M_y$

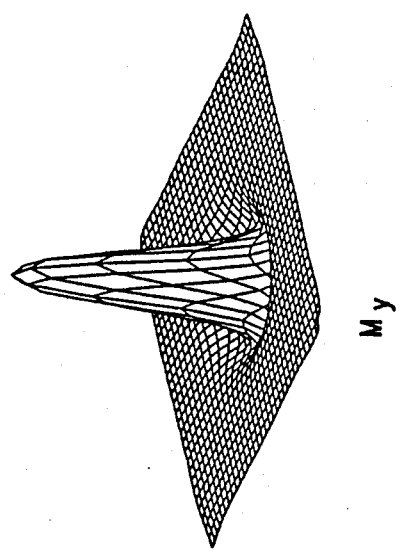
FIG. 15B  $M_y$
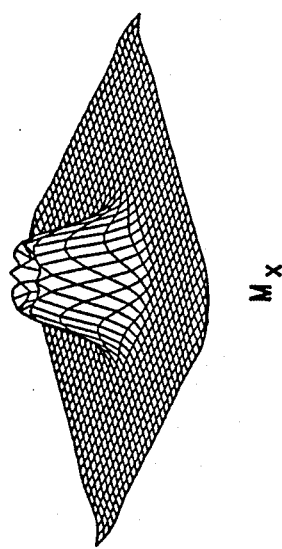
FIG. 15A  $M_x$

MAGNETIC RESONANCE IMAGING AND SPECTROSCOPY USING AN EXCITATION PULSE FOR MULTIPLE-DIMENSIONAL SELECTIVITY

The U.S. Government has rights in the disclosed invention pursuant to National Institute of Health grant #1R01HL39297 to Stanford University.

BACKGROUND OF THE INVENTION

This invention relates generally to magnetic resonance imaging (MRI) and spectroscopy, and more particularly the invention relates to a single excitation pulse that is simultaneously selective in multiple spatial dimensions.

Nuclear magnetic resonance (NMR) imaging, also called magnetic resonance imaging (MRI), is a non-destructive method for the analysis of materials and represents a new approach to medical imaging. It is completely non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

A descriptive series of papers on NMR appeared in the June 1980 issue of the *IEEE Transactions on Nuclear Science*, Vol. NS-27, pp. 1220–1255. The basic concepts are described in the lead article, "Introduction to the Principles of NMR," by W. V. House, pp. 1220–1226, which employ computed tomography reconstruction concepts for reconstructing cross-sectional images. A number of two-and three-dimensional imaging methods are described. Medical applications of NMR are discussed by Pykett in "NMR Imaging in Medicine," *Scientific American*, May 1982, pp. 78–88, and by Mansfield and Morris, *NMR Imaging in Biomedicine*, Academic Press, 1982.

Briefly, a strong static magnetic field is employed to line up atoms whose nuclei have an odd number of protons and/or neutrons, that is, have spin angular momentum and a magnetic dipole moment. A second RF magnetic field, applied as a single pulse transverse to the first, is then used to pump energy into these nuclei, flipping them over, for example to 90° to 180°. After excitation the nuclei gradually return to alignment with the static field and give up the energy in the form of weak but detectable free induction decay (FID). These FID signals are used by a computer to produce images.

The excitation frequency, and the FID frequency, is defined by the Larmor relationship which states that the angular frequency, $\omega_0$, of the precession of the nuclei is the product of the magnetic field, $B_o$, and the so-called magnetogyric ratio, $\gamma$, a fundamental physical constant for each nuclear species:

$$\omega_o = B_o \cdot \gamma$$

Accordingly, by superimposing a linear gradient field, $B_z = z \cdot G_z$, on the static uniform field, $B_o$, which defines the Z axis, for example, nuclei in a selected X-Y plane can be excited by proper choice of the frequency spectrum of the transverse excitation field applied along the X or Y axis. Similarly, a gradient field can be applied in the X-Y plane during detection of the FID signals to spatially localize the FID signals in the plane. The angle of nuclei spin flip in response to an RF pulse excitation is proportional to the integral of the pulse over time.

A k-space interpretation of small-tip excitation is given by Pauly, Nishimura, and Macovski in "A k-space Analysis of Small-Tip-Angle Excitation," *Journal of Magnetic Resonance* 81, 43–56 (1989). The present invention uses this k-space interpretation of small-tip-angle excitation to provide a two-dimensional selective excitation which can produce immediate slice refocusing.

SUMMARY OF THE INVENTION

An object of the present invention is a magnetic resonance pulse excitation that is multi-dimensional in selectivity.

Another object of the invention is a magnetic resonance pulse which is inherently refocused.

Still another object of the invention is an improved method of designing a multi-dimensional selective excitation pulse.

The design of two-dimensional selective excitation pulses uses the k-space interpretation given by Pauly et al., supra, and is expressed therein. Briefly, a conventional magnetic resonance imaging system can be employed in which a strong static magnetic field, $B_0$, has one or more time varying gradient fields, $G_x(t)$, $G_y(t)$, and $G_z(t)$, applied thereto. An RF field, $B_1(t)$, is applied to achieve the desired spatial frequency weighting. The design of the two-dimensional selective excitation includes choosing a spatial frequency weighting function $D(k)$ whose Fourier transform is the desired localization. A spatial weighting function $W(k)$ and a spatial frequency sampling function $S(k)$ are chosen such that $W(k)$ and $S(k)$ approximates $D(k)$. One example of a two-dimensional k-space trajectory is a constant angular rate spiral. By selecting the k-trajectory spiral to end at the origin in the k plane, the selected volume will refocus automatically. The time domain gradient waveforms and the RF excitation pulse can then be defined from the k-space trajectory definition. The pulses are useful for localized spectroscopy, for restricting the field of view in fast imaging, and for restricting the projection direction for projection imaging.

The invention and objects and features thereof will be more readily apparent from the following detailed description and appended claims when taken with the drawing.

BRIEF DESCRIPTION OF THE DRAWINGS

FIGS. 1A–1D illustrate the arrangement of conventional MRI apparatus and magnetic fields generated therein.

FIG. 2 is a functional block diagram of MRI imaging apparatus.

FIG. 3 illustrates a conventional basic pulse sequence for exciting a slab for projection imaging.

FIG. 4 is a plot of a conventional slice-selection excitation.

FIG. 5 is a plot of k-space interpretation of the pulse sequency of FIG. 4.

FIGS. 13A, 13B and 14A, 14B are surface plots of the real and imaginary selective volume of transverse magnetization using the gradient waveforms of FIG. 11 and the RF waveform of FIG. 12, resulting from tip angles of 30° and 90°, respectively.

FIGS. 15A–15B are surface plots similar to FIGS. 14A, 14B but with a half-cycle off resonance shift over the duration of the RF pulse.

DETAILED DESCRIPTION OF ILLUSTRATIVE EMBODIMENTS

Figure 6:
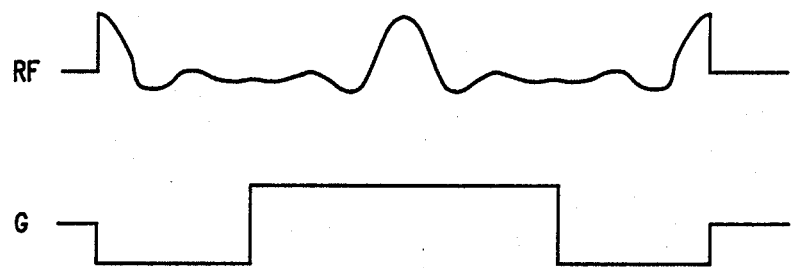
FIG. 6 is an inherently refocused slice-selection excitation pulse sequence.

Referring now to the drawings, FIG. 1A is a perspective view partially in section illustrating coil apparatus in an NMR imaging system, and FIGS. 1B–1D illustrate field gradients which can be produced in the apparatus of FIG. 1A. This apparatus is discussed by Hinshaw and Lent, "An Introduction to NMR Imaging: From the Bloch Equation to the Imaging Equation," Proceedings of the IEEE, Vol. 71, No. 3, Mar. 1983, pp. 338–350. Briefly, the uniform static field $B_o$ is generated by the magnet comprising the coil pair 10. A gradient field $G(x)$ is generated by a complex gradient coil set which can be wound on the cylinder 12. An RF field $B_1$ is generated by a saddle coil 14. A patient undergoing imaging would be positioned along the Z axis within the saddle coil 14.

In FIG. 1B an X gradient field is shown which is parallel to the static field $B_o$ and varies linearly with distance along the X axis but does not vary with distance along the Y or Z axes. FIGS. 1C and 1D are similar representations of the Y gradient and Z gradient fields, respectively.

FIG. 2 is a functional block diagram of the imaging apparatus as disclosed in *NMR-A Perspective on Imaging*, General Electric Company, 1982. A computer 20 is programmed to control the operation of the NMR apparatus and process FID signals detected therefrom. The gradient field is energized by a gradient amplifier 22, and the RF coils for impressing an RF magnetic moment at the Larmor frequency are controlled by the transmitter 24 and the RF coils 26. After the selected nuclei have been flipped, the RF coils 26 are employed to detect the FID signal which is passed to the receiver 28 and thence through digitizer 30 for processing by computer 20.

FIG. 3 is a graph illustrating applied RF pulses for a 180° flip angle and a 90° flip angle followed by a "time reversal" 180° pulse and the associated Z axis magnetic field gradient applied during application of the RF pulses. The illustrated pulses are conventional sinc pulses which have front and back lobes with a main RF pulse therebetween. From this representation, it can be seen that the angle of flip is proportional to the area under the pulse.

In accordance with the present invention, selective excitation pulses and time-varying gradients are provided to achieve two-dimensional selectivity and automatic refocusing. In designing the excitation pulse and time-varying gradients, the k-space interpretation of the resulting excitation is employed.

The approach proposed for analyzing selective excitation is based on the well-known small tip approximation. Using the approximation an integral expression may be found for the transverse magnetization produced by a selective excitation pulse. This expression may be interpreted as scanning a path in a spatial frequency space, or k-space.

SMALL TIP EXCITATION

The Bloch equation in the rotating frame, neglecting $T_1$ and $T_2$, is $$\begin{pmatrix} \dot{M}_x \\ \dot{M}_y \\ \dot{M}_z \end{pmatrix} = \gamma \begin{pmatrix} 0 & G \cdot x & -B_{1,y} \\ -G \cdot x & 0 & B_{1,x} \\ B_{1,y} & -B_{1,x} & 0 \end{pmatrix} \begin{pmatrix} M_x \\ M_y \\ M_z \end{pmatrix}. \quad [1]$$

G is the amplitude of the linear gradient, and $B_1$ is the amplitude of the applied RF field. Both are functions of time. The small tip approximation assumes that the longitudinal magnetization $M_z$ is approximately equal to its equilibrium value $M_0$, $$M_z \approx M_0 = \text{constant}. \quad [2]$$

This is true provided the excitation pulse rotates the magnetization vector M only a small angle from the +z axis. Under the assumption the first two components of Eq. 1 can be decoupled from the third. Define the transverse magnetization as $$M_{xy} = M_x + iM_y, \quad [3]$$

and the applied RF field as $$B_1 = B_{1,x} + iB_{1,y}. \quad [4]$$

Then the first two components of Eq. 1 can be written as the single complex differential equation $$\dot{M}_{xy} = -i\gamma G_x x M_{xy} + i\gamma B_1 M_0. \quad [5]$$

If the system is initially in the state $(0,0,M_O)$ this differential equation can be solved for the final magnetization at time T, $$M_{xy}(x) = i\gamma M_0 \int_0^T B_1(t) e^{-i\gamma x \int_t^T G(s)ds} dt. \quad [6]$$

This equation gives the transverse magnetization as a function of the applied RF and gradient fields, both of which are in general time-varying. The following will be examining the implications of this equation in detail.

K-SPACE INTERPRETATION

If I define a spatial frequency variable $k(t)$ as $$k(t) = -\gamma \int_t^T G(s)ds \quad [7]$$

then Eq. 6 may be rewritten $$M_{xy}(x) = i\gamma M_0 \int_0^T B_1(t)e^{ix\cdot k(t)}dt. \quad [8]$$

Note that in Eq. 7 the integration is from the time t to the time of the end of the excitation pulse. The function k(t) parametrically describes a path through spatial frequency space. One can write the exponential factor as an integral of a three dimensional delta function $$M_{xy}(x) = i\gamma M_0 \int_0^T B_1(t) \int_K \delta^3(k(t) - k)e^{ix\cdot k}dkdt. \quad [9]$$

Interchanging the order of integration, $$M_{xy}(x) = i\gamma M_0 \iint_K \left( \int_0^T B_1(t)\delta^3(k(t) - k)dt \right) e^{ix\cdot k}dk. \quad [10]$$

The inner integral over time is the three dimensional path which I will designate $$p(k) = \int_0^T B_1(t)\delta^3(k(t) - k)dt. \quad [11]$$

This expression shows the explicit weighting of k-space by the RF excitation $B_1(t)$. It also contains an implicit weighting due to the varying velocity with which k-space is scanned. To make this weighting explicit I normalize the delta function by multiplying it by the derivative of its argument. To preserve the equation I must then divide by the same factor. The result is $$p(k) = \int_0^T \frac{B_1(t)}{|\gamma G(t)|} \{\delta^3(k(t) - k)|\dot{k}(t)|\}dt, \quad [12]$$

where I have used the fact that $\dot{k}(t) = G(t)$, and assumed that $B_1(t)/|\gamma G(t)|$ is finite. The term in braces is now a unit delta function. Eq. 12 shows that the path scans k-space weighted by $B_1(t)/|\gamma G(t)|$. The expression for the transverse magnetization resulting from the selective excitation is then $$M_{xy}(x) = i\gamma M_0 \int_K p(k)e^{ix\cdot k}dk. \quad [13]$$

The resulting transverse magnetization is simply the Fourier transform of the weighted k-space trajectory.

A simpler and conceptually useful expression may be obtained for the case where the k-space trajectory does not cross itself. For this case I define a spatial weighting function.

$$W(k(t)) = \frac{B_1(t)}{|\gamma G(t)|}. \quad [14]$$

W(k) is left unspecified for k not on the k(t) trajectory. The idea is that $|\gamma G(t)|$ is a moving sample of a time independent function W(k). Later when I am concerned with designing selective excitation pulses this will become the Fourier transform of the desired localization. Substituting this expression back into Eq. 12, $$p(k) = \int_0^T W(k(t))\{\delta^3(k(t) - k)|\dot{k}(t)|\}dt \quad [15]$$

$$= W(k) \int_0^T \{\delta^3(k(t) - k)|\dot{k}(t)|\}dt.$$

Here I have used the fact that $f(\chi)\delta(\chi-\chi_0) = f(\chi_0)\delta(\chi-\chi_0)$. In Eq. 15 the path p(k) factors into two terms, the spatial weighting function W(k) and a parametric description of the unit weight trajectory $$S(k) = \int_0^T \{\delta^3(k(t) - k)|\dot{k}(t)|\}dt. \quad [16]$$

S(k) may be thought of as a sampling structure. It determines both the area and density of the k-space representation. The expression for the transverse magnetization given in Eq. 13 may now be rewritten as $$M_{xy}(x) = i\gamma M_0 \int_K W(k)S(k)e^{ix\cdot k}dk. \quad [17]$$

The transverse magnetization is the Fourier transform of a spatial frequency weighting function W(k) multiplied by a spatial frequency sampling function S(k). I will return to this expression when I consider the design of selective excitation pulses.

CONVENTIONAL SLICE SELECTIVE EXCITATION

The conventional slice selective excitation pulse sequence is shown in FIG. 4. A constant gradient is applied as a sinc RF waveform is played out. This produces an approximately rectangular slice profile. After the RF waveform has ended the gradient is reversed to refocus the selected slice. In the small tip case the area under the refocusing lobe is one half the area under the slice select lobe.

The k-space interpretation is illustrated in FIG. 5. k-space is scanned linearly as the RF field is applied. Note that in Eq. 7 the location in k-space at a time t is the integral of the remaining gradient waveform. Hence the origin in k-space is reached when the remaining gradient integrates to 0. This occurs half way through the slice select gradient lobe, and halfway through the RF excitation. The RF weighting is then centered in k-space and is symmetric about the origin. The slice profile, which is the Fourier transform of this RF weighting, is in phase. During the refocusing lobe no RF is played out. Its purpose is simply to shift the k-space origin back to the middle of the RF excitation.

INHERENTLY REFOCUSED PULSES

This description of the conventional slice selective excitation suggests several generalizations. First, RF can be played out throughout the excitation pulse sequence provided the desired weighting of k-space is still achieved. Second, any RF and gradient waveform pair that ends at the middle of a symmetric weighting of k-space will automatically be refocused.

Figure 7:
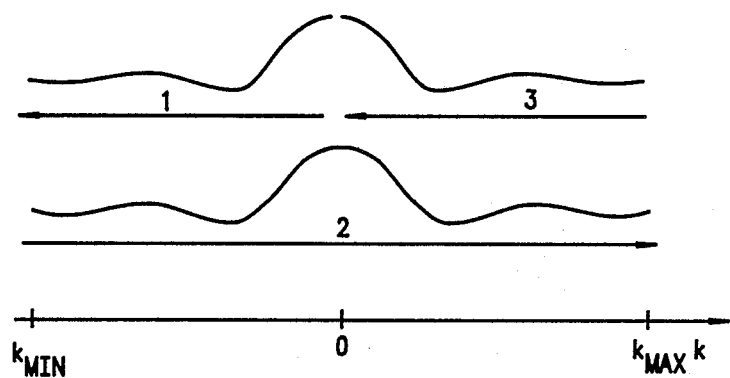
FIG. 7 is a k-space interpretation of the pulse sequence of FIG. 6.

A simple example of this is the pulse sequence shown in FIG. 6. Again, k-space is weighted by a sinc as it was in the conventional case. The k-space interpretation of this pulse sequence is shown in FIG. 7. The first gradient lobe scans k-space from the origin in the negative direction to $k_{min}$. During this lobe half of the sinc waveform is applied, starting at zero frequency. The second gradient lobe scans k-space from $k_{min}$ to $k_{max}$ while the whole sinc waveform is played out on the RF. The last gradient lobe scans k-space from $k_{max}$ back to the origin while the last half of the sinc waveform is applied, ending at zero frequency. The result is that k-space is symmetrically covered twice by the RF excitation. Since the k-space trajectory ends at the middle of this symmetric weighting the selected slice is in phase.

This pulse sequence is very similar to the conventional slice selective excitation pulse sequence discussed in the previous subsection. If the RF were turned off during the first and last lobes, the two are exactly the same. However, by scanning k-space twice the RF amplitude required is halved, the peak RF power quartered, and the total RF power is halved. One disadvantage of this pulse is some sensitivity to chemical shift.

Figure 8:
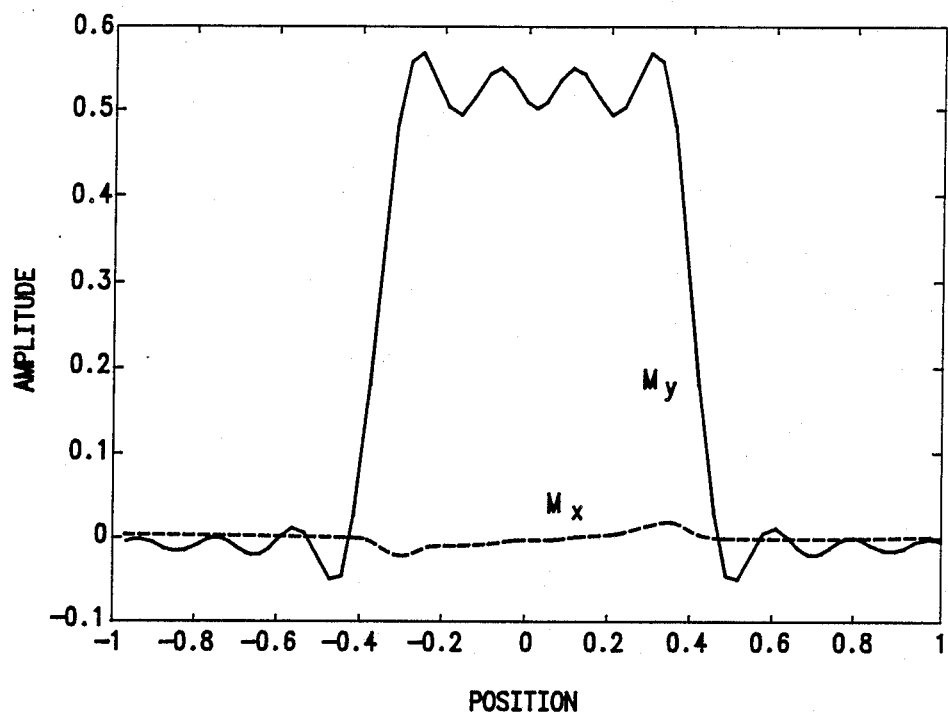
FIG. 8 is a slice profile resulting from the pulse sequency of FIG. 6.
Figure 9:
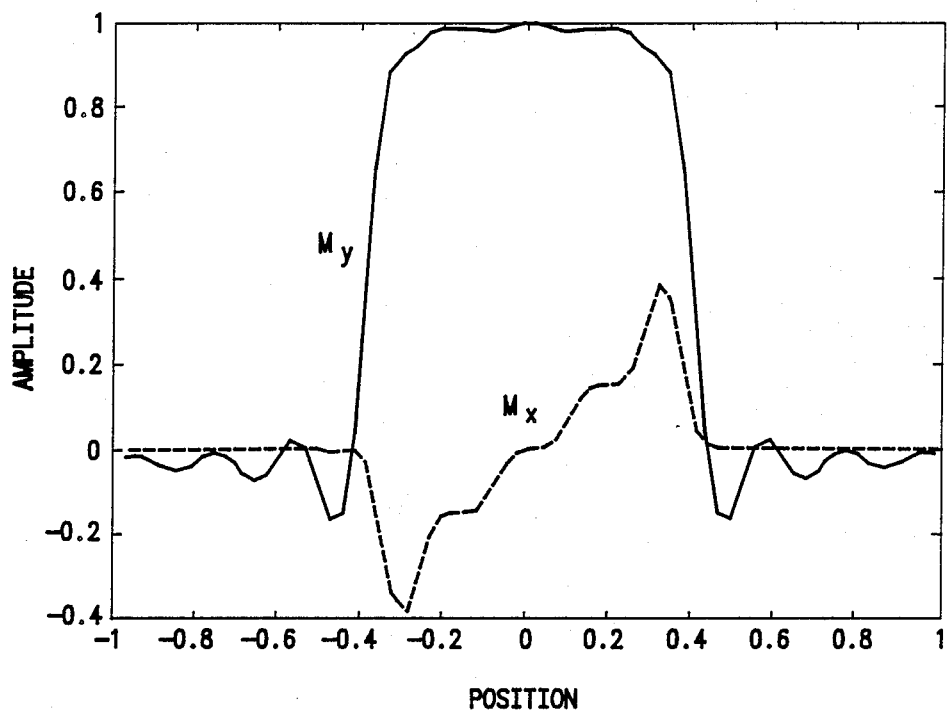
FIG. 9 is a slice profile resulting from the pulse sequence of FIG. 6 but with a tip angle of 90°.

Slice profiles for this pulse are given in FIGS. 8 and 9. These were obtained by numerical integration of the Bloch equation. FIG. 8 shows the slice profile for a 30° tip angle. This is approximately the limit of the small tip angle regime. The transverse magnetization is almost entirely in the imaginary component, $M_y$. This indicates the slice is very well refocused. FIG. 9 shows the slice profile for a 90° tip angle. This is well beyond the small tip angle regime. However, the slice profile is still reasonably well focused. Improved refocusing could be obtained with minor modifications of the gradient amplitudes. Even though this pulse sequence was designed using small tip angle arguments it still works well for tip angles on the order of 90°.

This approach also has the practical benefit of indicating how to utilize non-constant slice select gradients. The abrupt transitions required for the gradient waveform in FIG. 6 are difficult to produce practically. This is not a fundamental problem, since the critical quantity is the weighting of k-space. This is the ratio $Bl(t)/|\gamma(t)|$. Any gradient waveform can be used provided it covers the necessary part of k-space, and provided the RF waveform is compensated to produce the desired weighting. This is a special case of the more general variable rate selective excitation principle VERSE.

TWO-DIMENSIONAL SELECTIVE EXCITATION

The above discussion concerns the familiar problem of selectively exciting a slice. The following description concerns how this can be extended to two dimensions.

Another approach has recently been presented for achieving two dimensional spatial localization for spectroscopy using selective two dimensional 180° pulses. The approach here differs in two respects. First I am concerned with designing inherently refocused two-dimensional selective excitation pulses. Second, I show here an analytic approach for designing and analyzing the required RF and gradient waveforms.

The problem of a spatially-localizing excitation in two dimensions exactly parallels the problem of reconstructing an image from data taken with time-varying gradients. In both cases the goal is to cover some region of spatial frequency space by a gradient controlled trajectory. And, in both cases the resolution element or selective volume is the Fourier transform of this weighted trajectory.

Almost any of the methods that have been proposed for producing an MR image from one FID can also be used to produce two-dimensional spatially localized excitation. These include echo planar and its variations, constant-angular-rate spirals, constant-velocity spirals, and square spirals. The difference is that instead of acquiring data as the gradient field is applied, an RF field is applied to achieve the desired spatial frequency weighting. Note that as in the previous subsection, if k-space is weighted symmetrically and the k-space trajectory ends at the origin, then the selected volume is automatically refocused.

The design of a two-dimensional selective excitation starts by choosing a spatial frequency weighting function $D_k$ whose Fourier transform is the desired localization. Referring back to Eq. 17 we see that we want to find a spatial frequency weighting function W(k) and spatial frequency sampling function S(k) such that $W(k)S(k)$ is a good approximation to D(k). The choice of S(k) corresponds to choosing a k-space scanning trajectory, like the echo planar or the square spiral trajectories mentioned above. The requirements for the trajectory are exactly the same for excitation as they are for imaging. The trajectory should uniformly cover the part of k-space where D(k) has significant energy, and it should cover this region with sufficient density to limit aliasing. Given that S(k) fulfills these requirements we can let the weighting function be the desired spatial frequency weighting $W(k) = D(k)$.

As an example I will describe the design a circularly symmetric Gaussian localization excitation. The desired spatial frequency weighting D(k) is then also a circularly symmetric Gaussian function.

For a k-space trajectory I choose a constant-angular-rate spiral. This is illustrated in FIG. 6. Since I want to end up at the origin at the end of the pulse I start out at the edge of the spiral and come in. This assures that the slice will be refocused automatically. I could also start at the middle and spiral out, but then I would need a refocusing lobe at the end. This k-space trajectory can be written as $$k_x(t) = A\left(1 - \frac{t}{T}\right)\cos\frac{2\pi nt}{T} \qquad [18]$$

$$k_y(t) = A\left(1 - \frac{t}{T}\right)\sin\frac{2\pi nt}{T},$$

where the spiral has n cycles in a time T. In FIG. 6, n=8. In the radial dimension k-space is covered discretely. This will produce radial sidelobes, exactly analogous to aliasing due to a limited sampling rate. The number of cycles n determines how far out the first aliasing sidelobe will be. The factor A in Eq. 18 determines the size of the spiral in spatial frequency. The gradient waveforms that produce this k-trajectory are $G(t) = 1/\gamma\, K'(T)$, $$G_x(t) = -\frac{A}{\gamma T}\left[2\pi n\left(1 - \frac{t}{T}\right)\sin\frac{2\pi nt}{T} + \cos\frac{2\pi nt}{T}\right] \qquad [19]$$

$$G_y(t) = -\frac{A}{\gamma T}\left[2\pi n\left(1 - \frac{t}{T}\right)\cos\frac{2\pi nt}{T} - \sin\frac{2\pi nt}{T}\right].$$

These are plotted in FIG. 7.

The desired spatial frequency weighting is a circularly symmetric Gaussian function, which can be written as $$D(k) = \alpha e^{-\beta^2(k_x^2 + k_y^2)/A^2}. \quad [20]$$

The quantity $\alpha$ scales the tip angle, while $\beta$ determines the spatial resolution of the selective volume. Given that the spiral adequately samples k-space, we let $W_k = D(k)$. Then using Eq. 14 we can calculate the required RF waveform, $$B_1(t) = W(k(t))|\gamma G(t)| \quad [21]$$

$$= \alpha e^{-\beta^2(k_x^2(t)+k_y^2(t))/A^2} \gamma \frac{A}{T} \sqrt{\left[2\pi n\left(1-\frac{t}{T}\right)\right]^2 + 1}$$

$$= \gamma \alpha \frac{A}{T} e^{-\beta^2(1-\frac{t}{T})^2} \sqrt{\left[2\pi n\left(1-\frac{t}{T}\right)\right]^2 + 1}.$$

This is plotted in FIG. 8 for the case where $\beta = 2$.

Figure 10:
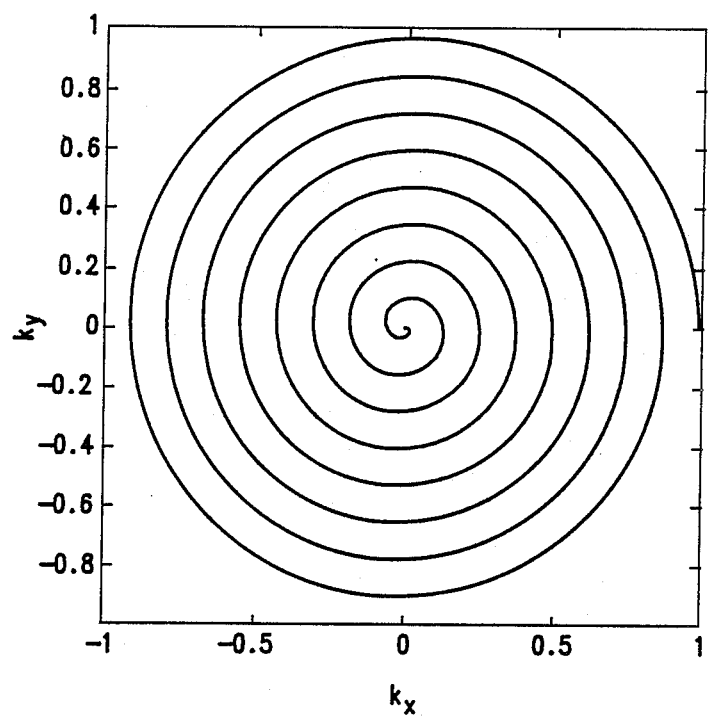
FIG. 10 is a plot of k-space trajectory for a spiral two-dimensional selective excitation.

The selective volume that results from this gradient and RF combination is plotted in FIGS. 9a, 9b AND 10a, 10b. FIGS. 9A, 9B are surface plots of the real and imaginary part of Mxy resulting from a 30° tip angle. Note that there is virtually no real component. The resulting magnetization is all along My. This means the volume is very well refocused. Also note that the sidelobes are very low. FIGS. 10A, 10B are surface plots of the excitation scaled to a 90° tip angle. This is well beyond the small tip angle regime. The slice is again very well focused, and again the side lobes are very low. This excitation pulse performs very well for tip angles on the order of 90°.

The selective volume can also be shifted to other spatial positions. To see this consider the effect of the following RF waveform:

$$B_1'(t) = B_1(t)e^{-ix_0 \cdot k(t)}. \quad [22]$$

Substituting this into Eq. 8, $$M_{xy}(x) = \gamma M_0 \int_0^T B_1(t)e^{-ix_0 \cdot k(t)}e^{ix \cdot k(t)} dt \quad [23]$$

$$= \gamma M_0 \int_0^T B_1(t)e^{i(x-x_0) \cdot k(t)} dt.$$

The excitation has been shifted spatially to the position $x_0$.

A concern with these two-dimensional selective excitation pulses is spectral sensitivity. The k-space analysis can easily be extended to include an additional spectral axis. This is beyond the scope of the present paper. Here I will simply note the nature of off-resonance effects. First, the duration of these pulses will result in some spectral selectivity. Second, there is a phase shift proportional to offset frequency. This can be refocused using a 180° pulse, just as a constant slice selective excitation pulse is refocused by reversing the slice select gradient. Third, the spatial selectivity of the pulse degrades with increasing offset frequency. This is a result of the particular k-space trajectory chosen.

Figure 11:
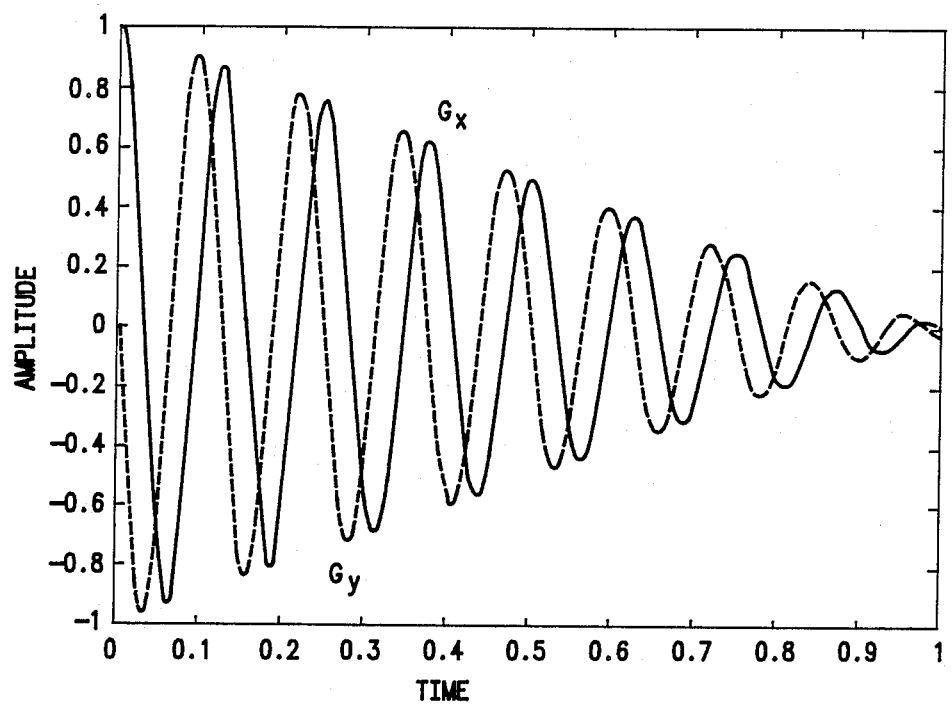
FIG. 11 is a plot of gradient waveforms that produce the k-space trajectory shown in FIG. 10.

As an example I calculated the selective volume corresponding to FIGS. 10A, 10B with a half cycle off-resonance shift over the duration of the pulse. This represents approximately 1 ppm shift for an 8 msec pulse at 1.5 T. The result is shown in FIGS. 11A, 11B. I have assumed refocusing with a 180° pulse followed by a delay of 0.45 times the pulse length. The $M_y$ component is relatively unchanged. The principle effect is the presence of an $M_x$ component. This represents both some loss in resolution and imperfect spatial phase coherence. These effects can be reduced by reducing the duration of the pulse, or by using a different k-space trajectory. In particular an echo-planar type excitation pulse will suffer almost no resolution degradation, although spectral shift will spatially shift the resolution volume in the slow gradient direction.

EXPERIMENTAL RESULTS

The selective excitation pulses in accordance with the invention and as described above are interesting from a theoretical viewpoint. To show such pulses are useful practically, the two dimensional selective excitation pulse was implemented on a 1.5 T General Electric Signa system. The system is stock in all relevant aspects, and does not have shielded gradient coils.

Figure 12:
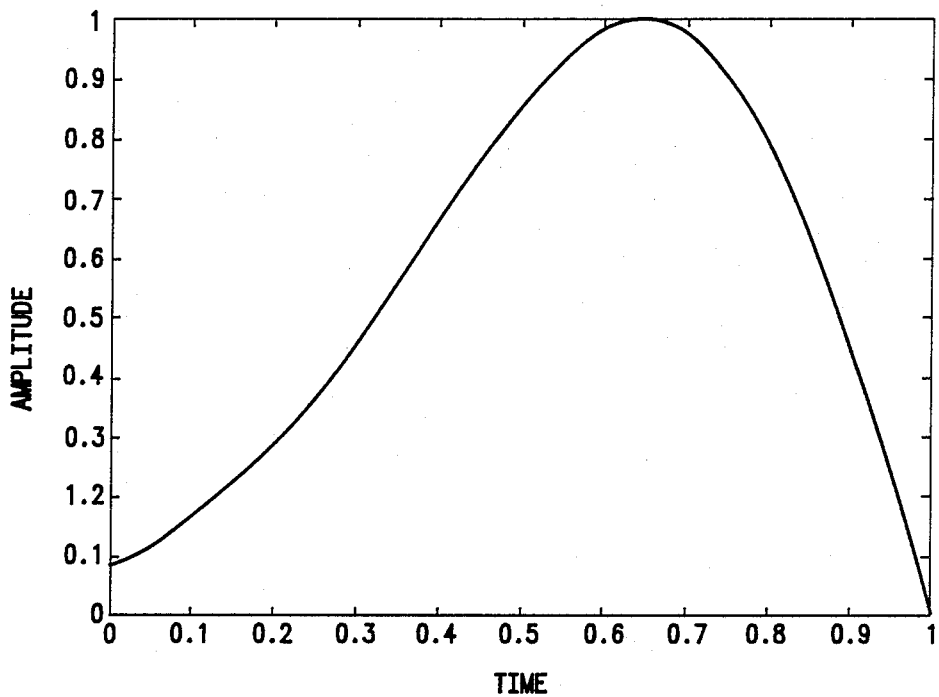
FIG. 12 is a plot of RF waveform that will produce a cylindrical Gaussian weighting of k-space when applied with the gradient waveforms shown in FIG. 11.
Figure 16:
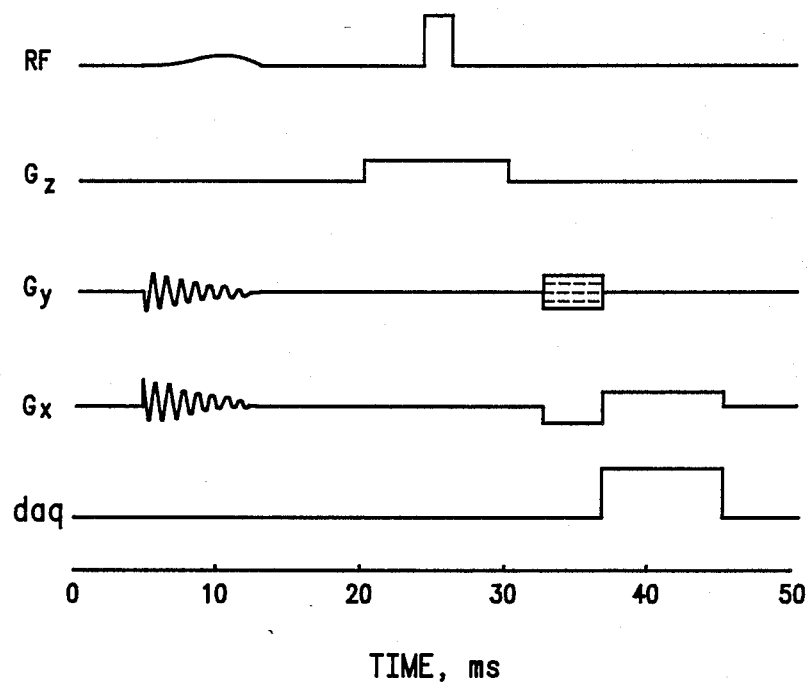
FIG. 16 illustrates a pulse sequence for two-dimensional selective excitation in accordance with the invention.
Figure 17:
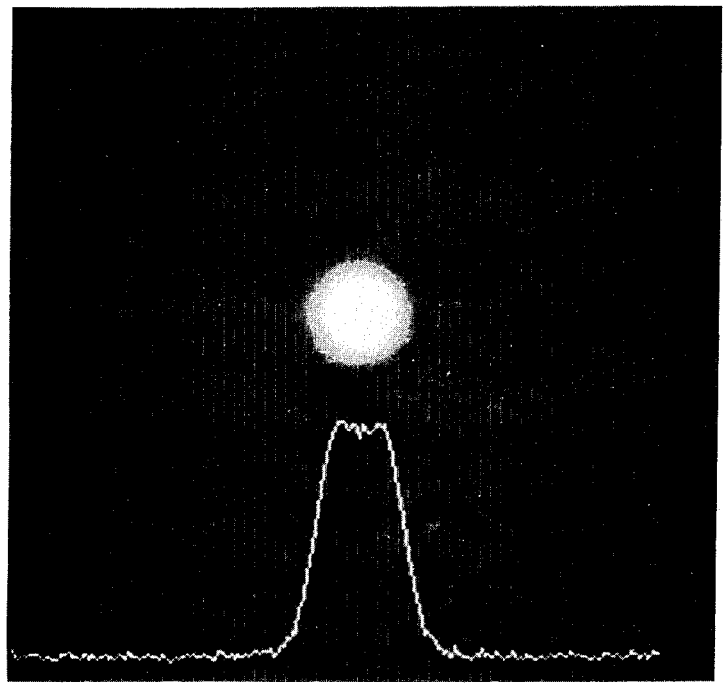
FIG. 17 is an image and a profile of a selected volume resulting from the pulse sequence of FIG. 16.

The pulse sequence is illustrated in FIG. 12. The two-dimensional selective excitation is applied to the x and y axes. This will excite a cylinder along the z axis. A slice of this cylinder is selected using a slice-selective 180° refocusing pulse. The resulting disk is then imaged using a conventional spin-warp imaging sequence.

An image of the localized volume is shown in FIG. 13. The phantom is a large volume of water doped with $CuSO_4$ to a $T_2$ of 200 msec. Also shown is a profile along a diameter of the selected volume. The duration of the two dimensional selective excitation was 8 msec, and the maximum gradient amplitude was 0.6 G/cm. The RF was scaled to produce a 90° excitation. The field of view is 24 cm, and the width of the selected volume is on the order of 3 cm. The first aliasing sidelobe due to radial sampling is outside of the phantom, which is 28 cm in diameter.

There have been described excitation pulses that are spatially selective in two dimensions. The selective excitation is considered to be a weighted scan through a spatial frequency space with the slice profile being the Forier transform of the weighted trajectory. The selective excitation is useful for localized spectroscopy, for restricting the field of view in fast imaging, and for restricting the projection direction for projection imaging.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims:

1. A method of obtaining multi-dimensional spatially selective magnetic resonance signals from a body comprising the steps of
   (a) applying a static magnetic field (Bo) to said body thereby aligning nuclear spins along an axis (z),
   (b) applying multiple time varying magnetic gradients Gx(t), Gy(t), Gz(t) during a time period, T, with said gradients chosen so that a region of spatial frequency space is covered,
   (c) applying during said time period, T, an RF excitation pulse (B1) to said body to tip said nuclear spins said RF excitation pulse being related to said times varying magnetic gradients by a first spatial frequency weighting function (W(k)(t)) whereby magnetic resonance signals transmitted by said tipped nuclear spins are spatially selective in multiple dimensions, (x,y,z), and (d) detecting said magnetic resonance signals.

2. The method as defined by claim 1 wherein the k-space trajectory of said RF excitation pulse ends at the k-space origin, whereby said RF excitation pulse is inherently refocused.

3. The method as defined by claim 2 wherein a spatial frequency variable k(t) is defined as $$k(t) = -\gamma \int_t^T G(s)ds$$

and a spatial weighting function W(k(t) is defined as $$W(k(t)) = \frac{B_1(t)}{|\gamma G(t)|}.$$

and a sampling structure S(k) is defined as $$S(k) = \int_0^T \{^3\delta(k(t) - k)|k(t)|\}dt.$$

whereby the transverse magnetization is the Fourier transform of the spatial frequency weighting multiplied by the spatial frequency sampling function $$M_{\chi v}(x) = i\gamma M_o \int_K W(k)S(k)e^{i\chi \cdot k}dk.$$

4. The method as defined by claim 1 wherein step (b) includes applying said two magnetic gradients with a second spatial weighting frequency weighting function (D(k)) which is related to said first spatial weighting function by a spatial frequency sampling function (S(k)) as follows:

$$W(k)S(k) \approx D(k)$$

5. The method as defined by claim 4 wherein said magnetic gradients are defined as $$G_x(t) = -\frac{A}{\gamma T}\left[2\pi n\left(1 - \frac{t}{T}\right)\sin\frac{2\pi nt}{T} + \cos\frac{2\pi nt}{T}\right]$$

$$G_y(t) = \frac{A}{\gamma T}\left[2\pi n\left(1 - \frac{t}{T}\right)\cos\frac{2\pi nt}{T} - \sin\frac{2\pi nt}{T}\right]$$

where
A = determines the size of a spiral scanning trajectory in spatial frequency, or k-space,
n = number of cycles in said spiral scanning trajectory,
γ = magnetogyric ratio for a selected nuclear species.

6. The method as defined by claim 5 wherein step (c) includes applying an RF excitation pulse defined as follows:

$$B_1(t) = W(k(t))|\gamma G(t)|$$

$$= \alpha e^{-\beta 2(ks2(t)+ky2(t))/A2} \gamma \frac{A}{T} \sqrt{\left[2\pi n\left(1 - \frac{t}{T}\right)\right]^2 + 1}$$

$$= \gamma \alpha \frac{A}{T} e^{-\beta 2(1 - \frac{t}{T})2} \sqrt{\left[2\pi n\left(1 - \frac{t}{T}\right)\right]^2 + 1}.$$

where
α = a tip angle scale
β = spatial resolution of a selective volume.

7. Apparatus for obtaining multi-dimensional spatially selective magnetic resonance signals comprising, (a) means for applying a static magnetic field (Bo) to said body thereby aligning nuclear spins along an axis (z), (b) means for applying multiple time varying magnetic gradients (Gx(t), Gy(t), Gz(t)) during a time period, T, with said gradients chosen so that a region of spatial frequency space is covered, (c) means for applying during said time period, T, an RF excitation pulse (B₁) to said body to tip said nuclear spins, said RF excitation pulse being related to said time varying magnetic gradients by a first spatial frequency weighting function (W(k)(t)) whereby magnetic resonance signals transmitted by said tipped nuclear spins are spatially selective in two dimensions, (χ,Y), and (d) means for detecting said magnetic resonance signals.

8. Apparatus as defined by claim 7 wherein said means for applying two magnetic gradients applies gradients with a second spatial weighting frequency weighting function (D(h)) which is related to said first spatial weighting function by a spatial frequency sampling function (S(k)) as follows:

$$W(k)S(k) \approx D(k).$$

9. Apparatus as defined by claim 8 wherein said magnetic gradients are defined as $$G_x(t) = -\frac{A}{\gamma T}\left[2\pi n\left(1 - \frac{t}{T}\right)\sin\frac{2\pi nt}{T} + \cos\frac{2\pi nt}{T}\right]$$

$$G_y(t) = \frac{A}{\gamma T}\left[2\pi n\left(1 - \frac{t}{T}\right)\cos\frac{2\pi nt}{T} - \sin\frac{2\pi nt}{T}\right]$$

where
A = determines the size of a spiral scanning trajectory in spatial frequency, or k-space,
n = number of cycles in said spiral scanning trajectory,
γ = magnetogyric ratio for a selected nuclear species.

10. Apparatus as defined by claim 9 wherein said RF excitation pulse is defined as follows:

$$B_1(t) = W(k(t))|\gamma G(t)|$$

$$= \alpha e^{-\beta 2(ks2(t)+ky2(t))/A2} \gamma \frac{A}{T} \sqrt{\left[2\pi n\left(1 - \frac{t}{T}\right)\right]^2 + 1}$$

-continued $$= \gamma a \frac{A}{T} e^{-\beta 2(1-\frac{t}{T})^2} \sqrt{\left[2\pi n \left(1 - \frac{t}{T}\right)\right]^2 + 1}.$$

where

= a tip angle scale $\beta$ = spatial resolution of a selective volume.

11. Apparatus as defined by claim 7 wherein the k-space trajectory of said RF excitation pulse ends at the k-space origin, whereby said RF excitation pulse is inherently refocused.

12. Apparatus as defined by claim 11 wherein a spatial frequency variable k(t) is defined as $$k(t) = -\gamma \int_t^T G(s) ds$$

and a spatial weighting function W(k(t)) is defined as $$W(k(t)) = \frac{B_1(t)}{|\gamma G(t)|}.$$

and a sampling structure S(k) is defined as $$S(k) = \int_0^T \{^3\delta(k(t) - k) | \dot{k}(t) | \} dt.$$

whereby the transverse magnetization is the Fourier transform of the spatial frequency weighting multiplied by the spatial frequency sampling function $$M_{\chi \upsilon}(x) = i \gamma M_0 \int_K W(k) S(k) e^{ix \cdot k} dk.$$

* * * * *